(12) United States Patent
Ma et al.

(10) Patent No.: US 10,763,321 B2
(45) Date of Patent: Sep. 1, 2020

(54) OLED DISPLAY PANEL, METHOD FOR MANUFACTURING THE SAME AND DISPLAY DEVICE

(71) Applicant: BOE TECHNOLOGY GROUP CO., LTD., Beijing (CN)

(72) Inventors: Weixin Ma, Beijing (CN); Meng Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 87 days.

(21) Appl. No.: 16/106,146

(22) Filed: Aug. 21, 2018

(65) Prior Publication Data

US 2019/0172886 A1 Jun. 6, 2019

(30) Foreign Application Priority Data

Dec. 1, 2017 (CN) .......................... 2017 1 1250922

(51) Int. Cl.
*H01L 27/32* (2006.01)
*G06K 9/00* (2006.01)

(52) U.S. Cl.
CPC ........ *H01L 27/3272* (2013.01); *G06K 9/0004* (2013.01); *H01L 27/3227* (2013.01);
(Continued)

(58) Field of Classification Search
CPC ............. H01L 27/3272; H01L 27/3227; H01L 27/3234; H01L 27/3258; H01L 27/3276;
(Continued)

(56) References Cited

U.S. PATENT DOCUMENTS

2017/0220844 A1* 8/2017 Jones ................... G06K 9/0053
2018/0012069 A1* 1/2018 Chung ................. A61B 5/1172
(Continued)

FOREIGN PATENT DOCUMENTS

CN 204289453 U 4/2015
CN 106298859 A 1/2017
(Continued)

OTHER PUBLICATIONS

Office action issued in Chinese Application No. 201711250922.8, dated Nov. 15, 2019, 15 pages.
(Continued)

*Primary Examiner* — John B Strege
(74) *Attorney, Agent, or Firm* — Dave Law Group LLC; Raj S. Dave

(57) ABSTRACT

The present disclosure relates to an OLED display panel, a method for manufacturing the same and a display device. The OLED display panel includes: a substrate; a thin film transistor and a photosensitive device for fingerprint recognition on the substrate; a transparent dielectric layer on the substrate and the thin film transistor; a light-shielding-planarization single layer on the transparent dielectric layer, wherein the light-shielding-planarization single layer has a first hole exposing the transparent dielectric layer, and a projection of the first hole on the substrate overlays with a projection of the photosensitive device on the substrate; and an organic light emitting device on the light-shielding-planarization single layer, wherein the organic light emitting device is connected to a source/drain electrode of the thin film transistor through a second hole penetrating the light-shielding-planarization single layer.

20 Claims, 7 Drawing Sheets

(52) U.S. Cl.
CPC ...... *H01L 27/3234* (2013.01); *H01L 27/3258* (2013.01); *H01L 2227/323* (2013.01)

(58) Field of Classification Search
CPC ...... H01L 2227/323; H01L 2251/5315; G06K 9/0004
See application file for complete search history.

(56) References Cited

U.S. PATENT DOCUMENTS

| | | |
|---|---|---|
| 2018/0040675 A1 | 2/2018 | Zeng et al. |
| 2018/0060641 A1* | 3/2018 | Kim .................... G06K 9/00013 |
| 2018/0212199 A1* | 7/2018 | Yu ........................ H01L 51/5275 |
| 2018/0373913 A1* | 12/2018 | Panchawagh ........ G06K 9/0002 |
| 2019/0026523 A1* | 1/2019 | Shen .................... G06K 9/3275 |
| 2019/0156097 A1 | 5/2019 | Liu et al. |

FOREIGN PATENT DOCUMENTS

| | | |
|---|---|---|
| CN | 107122742 A | 4/2017 |
| CN | 106684202 A | 5/2017 |
| WO | 2017074097 A1 | 5/2017 |

OTHER PUBLICATIONS

Office action issued in Chinese Application No. 201711250922.8, dated Apr. 17, 2020, 9 pages.

* cited by examiner

OLED DISPLAY PANEL, METHOD FOR MANUFACTURING THE SAME AND DISPLAY DEVICE

CROSS-REFERENCE TO RELATED APPLICATION

This patent application claims the benefit and priority of China Patent Application No. 201711250922.8, filed Dec. 1, 2017. The entire disclosure of the above application is incorporated herein by reference

FIELD

The present disclosure relates to the field of display technologies, and in particular, to an OLED display panel, method for manufacturing the same and display device.

BACKGROUND

This section provides background information related to the present disclosure which is not necessarily prior art.

Organic Light Emitting Diode (OLED) display device has the advantages of low energy consumption, high brightness, fast response time, wide viewing angle, light weight, etc. Recently, the OLED display device has been widely applied to these devices such as mobile communication terminals, personal digital assistants, handheld computers, etc. With the rapid development of display technology, display panels with fingerprint recognition functions have gradually spread throughout people's lives.

SUMMARY

This section provides a general summary of the disclosure, and is not a comprehensive disclosure of its full scope or all of its features.

Embodiments of the present disclosure provide a display panel, a method for manufacturing the same and a display device.

According to a first aspect of the present disclosure, there is provided an OLED display panel. The OLED display panel includes: a substrate; a thin film transistor and a photosensitive device for fingerprint recognition on the substrate; a transparent dielectric layer on the substrate and the thin film transistor; and a light-shielding-planarization single layer on the transparent dielectric layer, wherein the light-shielding-planarization single layer has a first hole exposing the transparent dielectric layer, and a projection of the first hole on the substrate overlays with a projection of the photosensitive device on the substrate; and an organic light emitting device on the light-shielding-planarization single layer, wherein the organic light emitting device is connected to a source/drain electrode of the thin film transistor through a second hole penetrating the light-shielding-planarization single layer.

In an embodiment of the present disclosure, a material of the light-shielding-planarization single layer includes a black organic material.

In an embodiment of the present disclosure, the black organic material includes polyimide.

In an embodiment of the present disclosure, the OLED display panel further includes a barrier layer between the light-shielding-planarization single layer and the light emitting device, wherein the barrier layer has a third hole exposing the transparent dielectric layer, and a sidewall of the third hole is continuous with a sidewall of the first hole.

In an embodiment of the present disclosure, the thin film transistor and the photosensitive device are on the same side of the substrate.

In an embodiment of the present disclosure, the thin film transistor and the photosensitive device are on different sides of the substrate.

In an embodiment of the present disclosure, a diameter range of the first hole is 2-3 μm.

In an embodiment of the present disclosure, the substrate is transparent.

According to a second aspect of the present disclosure, there is provided a display device including the OLED display panel described in the first aspect of the present disclosure.

According to a third aspect of the present disclosure, there is provided a method for manufacturing an OLED display panel. The method includes: providing a substrate; forming a thin film transistor and a photosensitive device for fingerprint recognition on the substrate; forming a transparent dielectric layer covering the substrate and the thin film transistor; forming a light-shielding-planarization single layer on the transparent dielectric layer; patterning the light-shielding-planarization single layer to form a first hole exposing the transparent dielectric layer and a second hole exposing a source/drain electrode of the thin film transistor in the light-shielding-planarization single layer, wherein a projection of the first hole on the substrate overlays with a projection of the photosensitive device on the substrate; and forming an organic light emitting device on the light-shielding-planarization single layer, wherein the organic light emitting device is connected to the source/drain electrode of the thin film transistor through the second hole.

In an embodiment of the present disclosure, a material of the light-shielding-planarization single layer includes a black organic material.

In an embodiment of the present disclosure, the black organic material includes polyimide.

In an embodiment of the present disclosure, after forming the light-shielding-planarization single layer and before patterning the light-shielding-planarization single layer, the method further includes: forming a barrier layer on the light-shielding-planarization single layer; and patterning the barrier layer to form a third hole and a fourth hole exposing the light-shielding-planarization single layer, wherein a projection of the third hole on the substrate overlays with the projection of the photosensitive device on the substrate, and a projection of the fourth hole on the substrate overlays with a projection of the source/drain electrode on the substrate, wherein patterning the light-shielding-planarization single layer includes etching the light-shielding-planarization single layer using the barrier layer as a mask to form the first hole and the second hole.

In an embodiment of the present disclosure, forming a thin film transistor and a photosensitive device for fingerprint recognition on the substrate includes forming the thin film transistor and the photosensitive device on the same side of the substrate.

In an embodiment of the present disclosure, forming a thin film transistor and a photosensitive device for fingerprint recognition on the substrate includes forming the thin film transistor and the photosensitive device on opposite sides of the substrate, respectively.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

Further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

The flow diagrams depicted herein are just one example. There may be many variations to this diagram or the steps described therein without departing from the spirit of the disclosure. For instance, the steps may be performed in a differing order or steps may be added, deleted or modified. All of these variations are considered a part of the claimed disclosure.

Example embodiments will now be described more fully with reference to the accompanying drawings.

Figure 1:
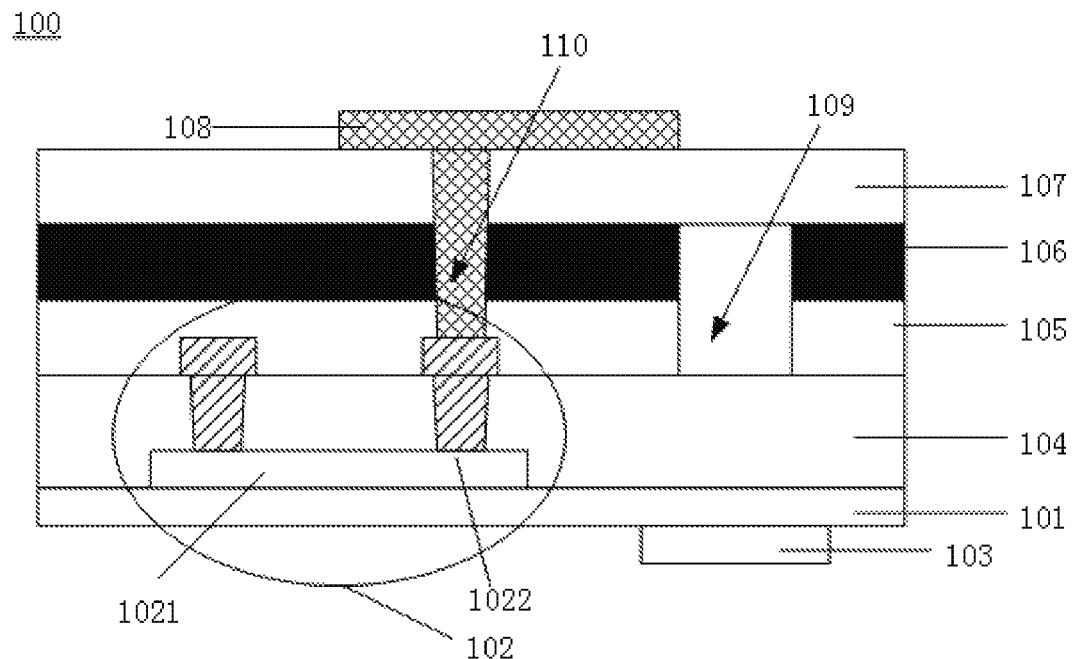
FIG. 1 is a schematic view of a cross section structure of an OLED display panel.

FIG. 1 is a schematic view of a cross section structure of an OLED display panel 100. As shown in FIG. 1, the OLED display panel 100 includes a substrate 101, a thin film transistor 102 on the substrate 101, a photosensitive device 103 for fingerprint recognition, a transparent dielectric layer 104 on the substrate 101 and the thin film transistor 102, a silicon nitride layer 105 on the transparent dielectric layer 104, a metal light-shielding layer 106 on the silicon nitride layer 105, a planarization layer 107 on the metal light-shielding layer 106, and an organic light emitting device 108 on the planarization layer 107. The thin film transistor 102 and the photosensitive device 103 are on different sides of the substrate 101. The planarization layer 107 covers the metal light-shielding layer 106 and a hole 109. A projection of the photosensitive device 103 on the substrate 101 does not overlay with a projection of the thin film transistor 102 on the substrate 101. The silicon nitride layer 105 and the metal light-shielding layer 106 have the hole 109 exposing the transparent dielectric layer 104 therein. A projection of the hole 109 on the substrate 101 overlays with the projection of the photosensitive device 103 on the substrate 101. A projection of the organic light emitting device 108 on the substrate 101 does not overlay with the projection of the hole 109 on the substrate 101. The organic light emitting device 108 is connected to a source/drain electrode 1022 of the thin film transistor 102 through a hole 110 penetrating the silicon nitride layer 105, the metal light-shielding layer 106 and the planarization layer 107. The thin film transistor 102 further includes an active layer 1021 and a gate (not shown).

In an OLED display panel available for fingerprint recognition, a fingerprint recognition function is realized by forming a metal light-shielding layer on the entire surface of the a substrate and then forming a small hole for pinhole imaging on the metal light-shielding layer. Further, a planarization layer is also formed on the metal light-shielding layer. However, forming the metal light-shielding layer with a large area may cause a risk of static electricity accumulation.

In an embodiment of the present disclosure, there is provide an OLED display panel and a method for manufacturing the same, which can realize both light-shielding and planarization functions using a single material layer while avoiding static electricity accumulation.

Figure 2:
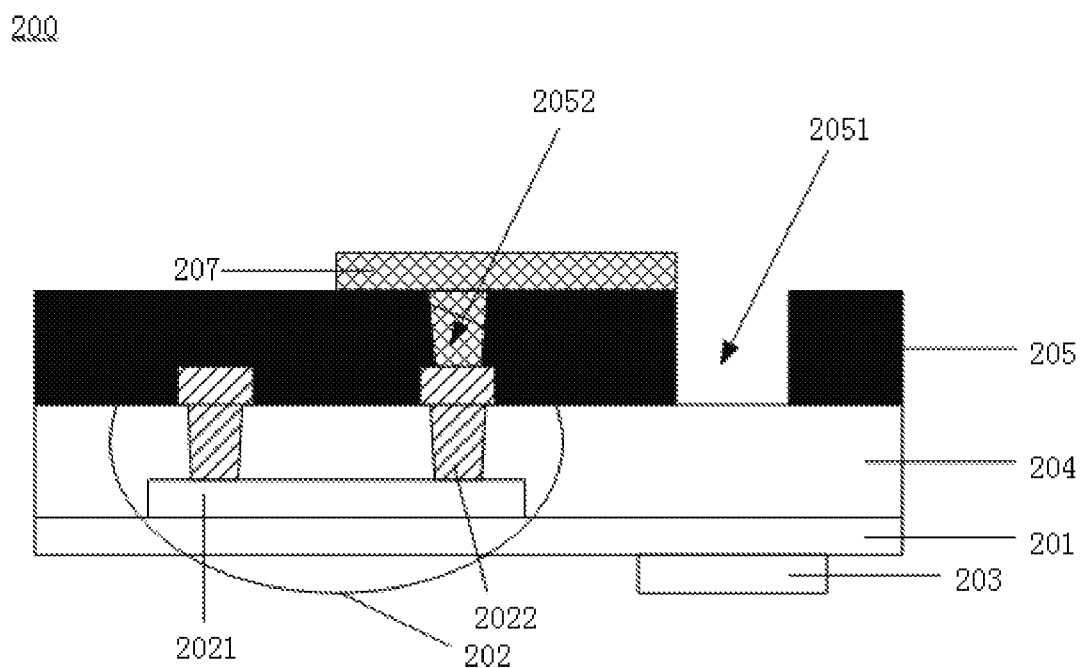
FIG. 2 is a schematic view of a cross section structure of an OLED display panel in accordance with an embodiment of the present disclosure.

FIG. 2 is a schematic view of a cross section structure of an OLED display panel 200 in accordance with an embodiment of the present disclosure. As shown in FIG. 2, the OLED display panel 200 includes a substrate 201, a thin film transistor 202 and a photosensitive device 203 for fingerprint recognition on the substrate 201, a transparent dielectric layer 204 on the substrate 201 and the thin film transistor 202, a light-shielding-planarization single layer 205 on the transparent dielectric layer 204, and an organic light emitting device 207 on the light-shielding-planarization single layer 205. A projection of the photosensitive device 203 on the substrate 201 does not overlay with a projection of the thin film transistor 202 on the substrate 201. The light-shielding-planarization single layer 205 has a first hole 2051 exposing the transparent dielectric layer 204 therein. A projection of the first hole 2051 on the substrate 201 overlays with the projection of the photosensitive device 203 on the substrate 201. A projection of the organic light emitting device 207 on the substrate 201 does not overlay with the projection of the first hole 2051 on the substrate 201. The organic light emitting device 207 is connected to a source/drain electrode 2022 of the thin film transistor 202 through a second hole 2052 penetrating the light-shielding-planarization single layer 205. The thin film transistor 202 further includes an active layer 2021 and a gate (not shown). It should be noted that the thin film transistor 202 in an embodiment of the present disclosure may be a top gate thin film transistor or a bottom gate thin film transistor, which is not specifically limited herein.

In an exemplary embodiment, a material of the light-shielding-planarization single layer 205 includes a black organic material.

In an exemplary embodiment, the black organic material includes a polyimide resin.

Figure 3:
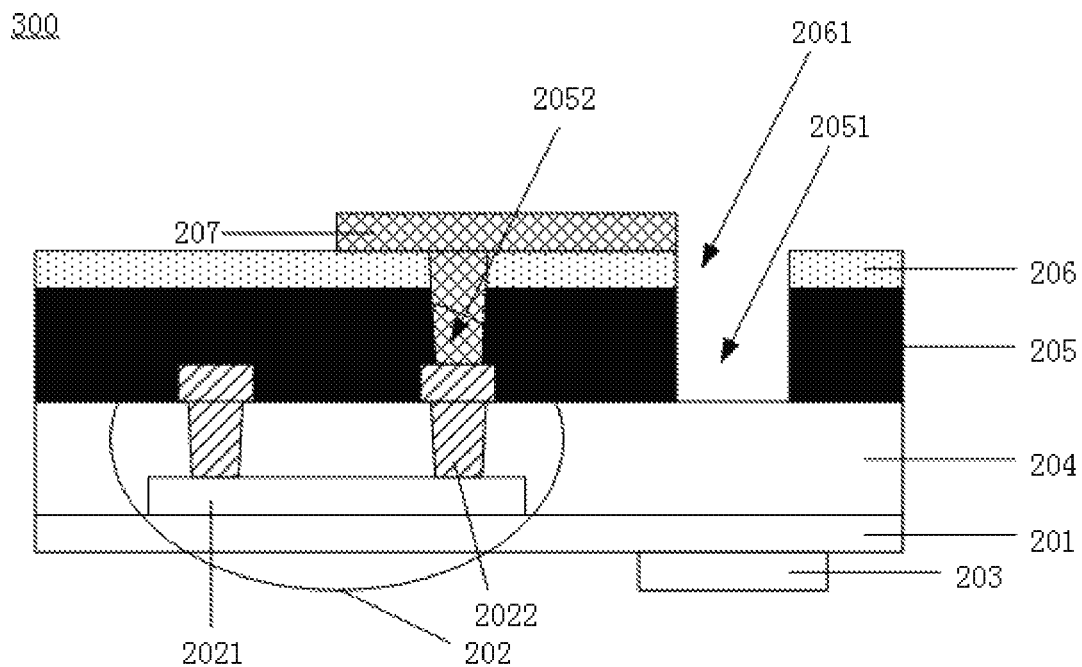
FIG. 3 is a schematic view of a cross section structure of an OLED display panel in accordance with an embodiment of the present disclosure.

FIG. 3 is a schematic view of a cross section structure of an OLED display panel 300 in accordance with an embodiment of the present disclosure. FIG. 3 differs from FIG. 2 in that the OLED display panel 300 further includes a barrier layer 206 between the light-shielding-planarization single layer 205 and the light emitting device 207. The barrier layer 206 has a third hole 2061 exposing the transparent dielectric layer 204. A sidewall of the third hole 2061 is continuous with a sidewall of the first hole 2051. That is, a projection of the third hole 2061 on the substrate 201 overlays with the projection of the photosensitive device 203 on the substrate 201.

It should be noted that the position and the connection relationship between the other components in FIG. 3 can be referred to the description about FIG. 2, which will not be repeated herein.

Further, in FIGS. 2 and 3, the thin film transistor 202 and the photosensitive device 203 are on different sides of the substrate 201.

Figure 4:
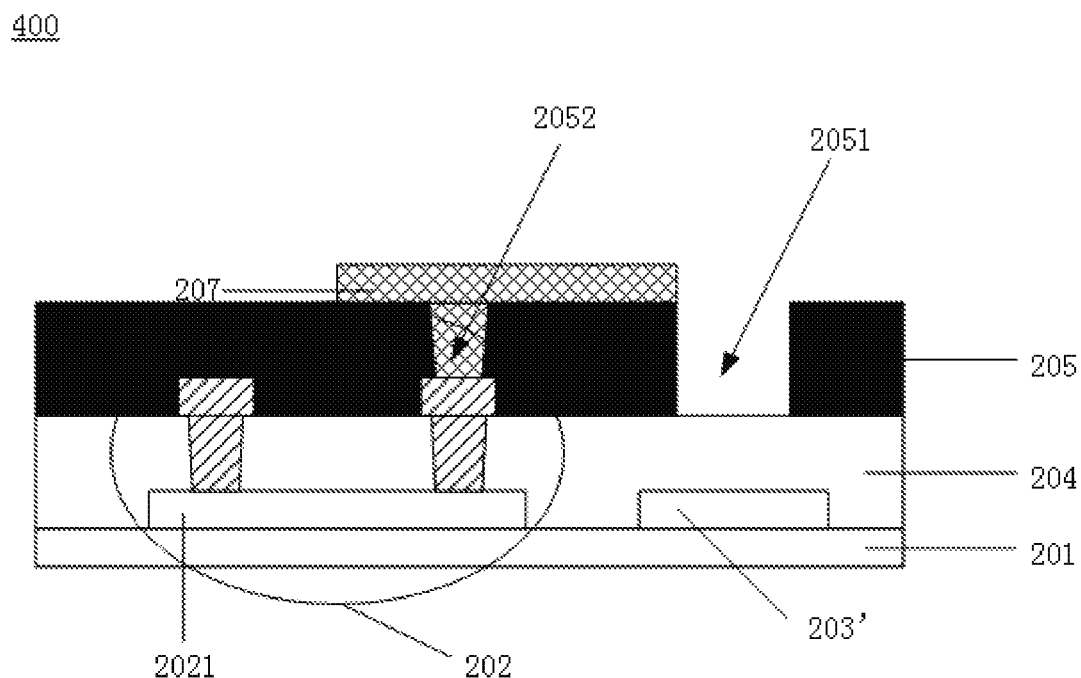
FIG. 4 is a schematic view of a cross section structure of an OLED display panel in accordance with an embodiment of the present disclosure.

FIG. 4 is a schematic view of a cross section structure of an OLED display panel 400 in accordance with an embodiment of the present disclosure. FIG. 4 differs from FIG. 2 in that the thin film transistor 202 and the photosensitive device 203' are on the same side of the substrate 201.

Figure 5:
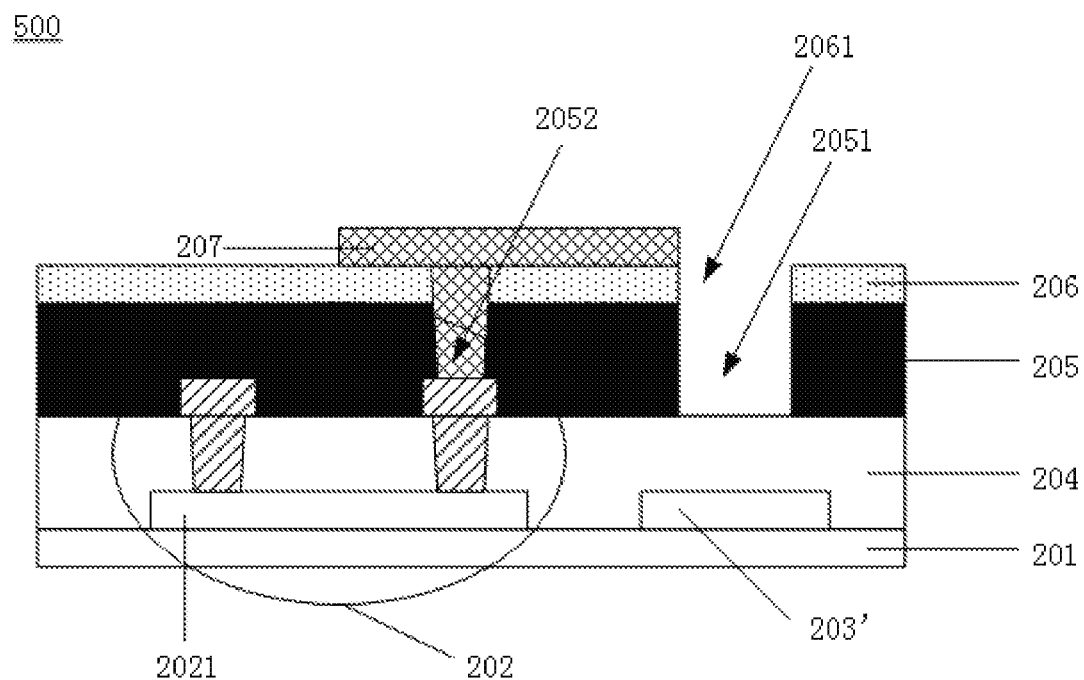
FIG. 5 is a schematic view of a cross section structure of an OLED display panel in accordance with an embodiment of the present disclosure.

FIG. 5 is a schematic view of a cross section structure of an OLED display panel 500 in accordance with an embodiment of the present disclosure. FIG. 5 differs from FIG. 3 in that the thin film transistor 202 and the photosensitive device 203' are on the same side of the substrate 201.

It should be noted that the position and connection relationship between other components in FIG. 4 can refer to the description about FIG. 2, and the position and connection relationship between other components in FIG. 5 can refer to the description about FIG. 3, which will not be repeated herein.

In an exemplary embodiment, a diameter range of the first hole 2051 is 2-3 µm. A diameter range of the third hole 2061 is also 2-3 µm.

In an exemplary embodiment, the substrate 201 is transparent.

In an embodiment of the present disclosure, when performing fingerprint recognition, a light reflected by a fingerprint is incident into the photosensitive device 203 or 203' through the third hole 2061 and the first hole 2051.

In an embodiment of the present disclosure, there is provided a display device including the OLED display panel as described above. The display device may be, for example, a mobile phone, a tablet, a television, a display, a notebook, a navigator, a wearable device, an e-book reader, or the like.

In an embodiment of the present disclosure, there is also provided a method for manufacturing an OLED display panel.

Figure 6:
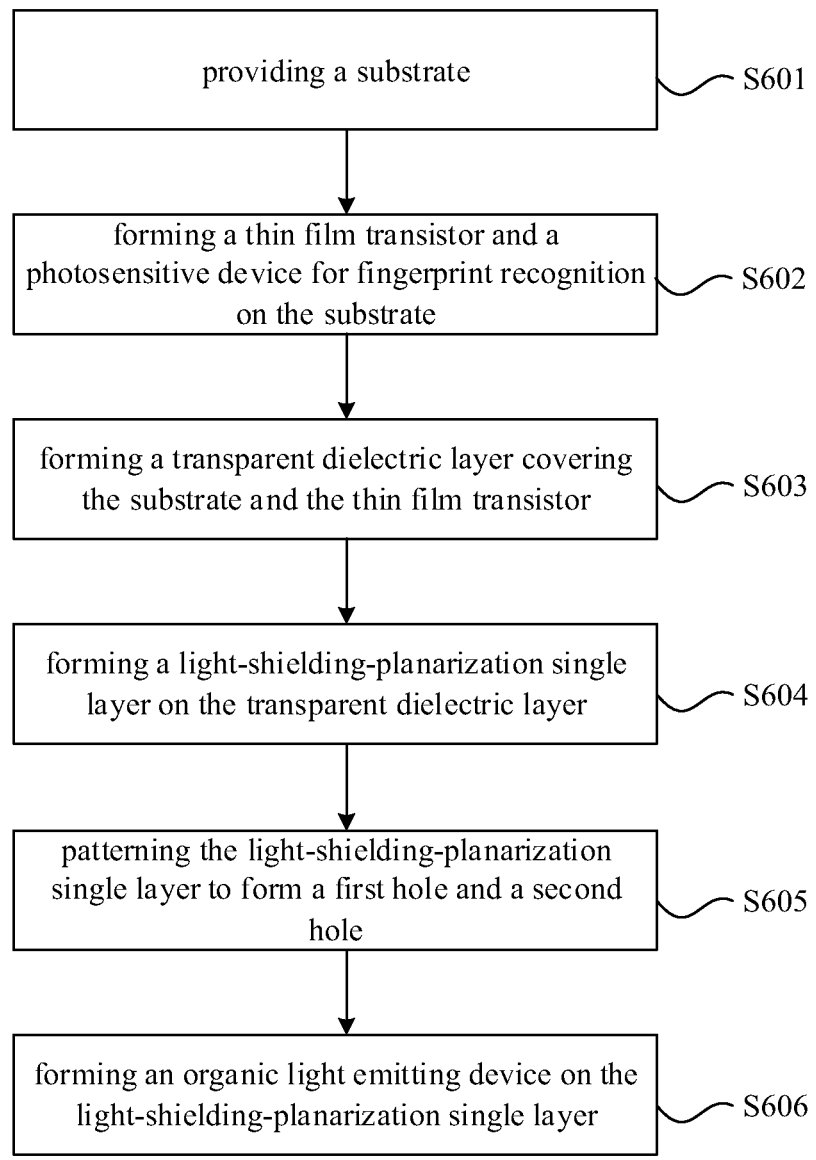
FIG. 6 is a flow chart of a method for manufacturing an OLED display panel in accordance with an embodiment of the present disclosure.

FIG. 6 is a flow chart of a method for manufacturing an OLED display panel in accordance with an embodiment of the present disclosure. As shown in FIG. 6, in step S601, a substrate is provided. In step S602, a thin film transistor and a photosensitive device for fingerprint recognition are formed on the substrate. In step S603, a transparent dielectric layer is formed to cover the substrate and the thin film transistor.

Figure 7:
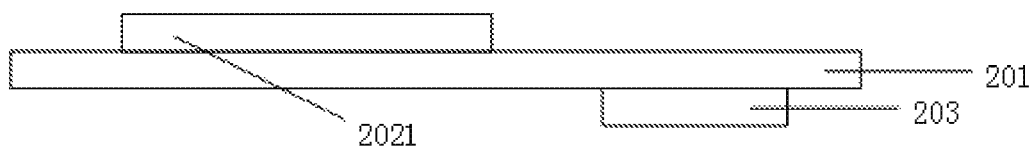
FIG. 7 is a schematic view of a method for manufacturing an OLED display panel in accordance with an embodiment of the present disclosure.
Figure 8:
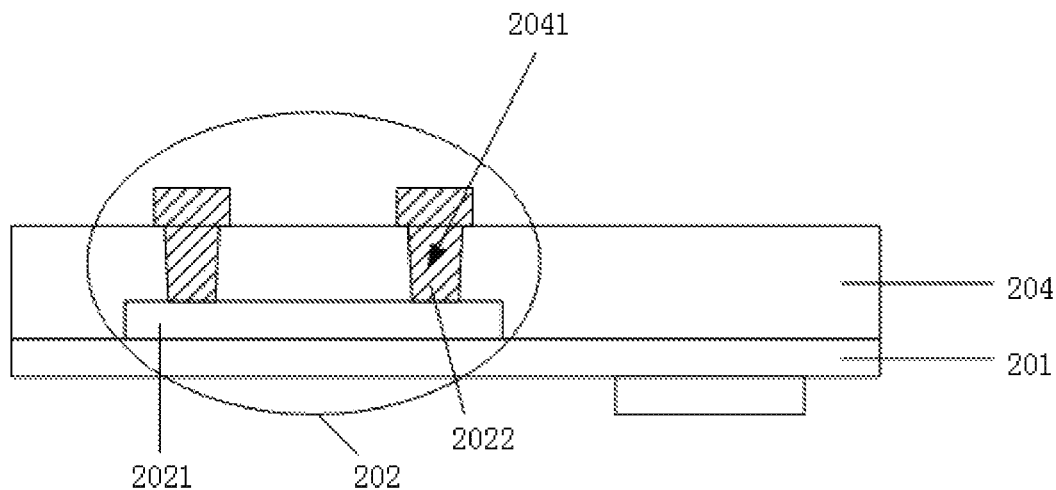
FIG. 8 is a schematic view of a method for manufacturing an OLED display panel in accordance with an embodiment of the present disclosure.

FIG. 7-14 are schematic views of a method for manufacturing an OLED display panel in accordance with an embodiment of the present disclosure. In an embodiment of the present disclosure, the thin film transistor and the photosensitive device are formed on different sides or the same side of the substrate, respectively. As shown in FIG. 7, an active layer 2021 of a thin film transistor and a photosensitive device 203 for fingerprint recognition are formed on opposite sides of the substrate 201, respectively. As shown in FIG. 8, a transparent dielectric layer 204 is formed on the substrate 201 and the active layer 2021, and then the transparent dielectric layer 204 is patterned to form an opening 2041 in the transparent dielectric layer 204 and a source/drain electrode 2022 of the thin film transistor 202 being connected to the active layer 2021 through the opening 2041 is formed.

It should be noted that the thin film transistor 202 in an embodiment of the present disclosure may be a top gate thin film transistor or a bottom gate thin film transistor, which will not be limited herein. In particular, when the thin film transistor 202 is a bottom gate thin film transistor, the active layer 2021 is between the substrate 201 and the gate, and when the thin film transistor 202 is a top gate thin film transistor, the gate is between the active layer 2021 and the substrate 201.

Figure 9:
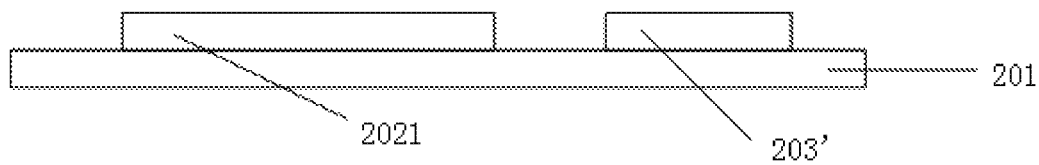
FIG. 9 is a schematic view of a method for manufacturing an OLED display panel in accordance with an embodiment of the present disclosure.
Figure 10:
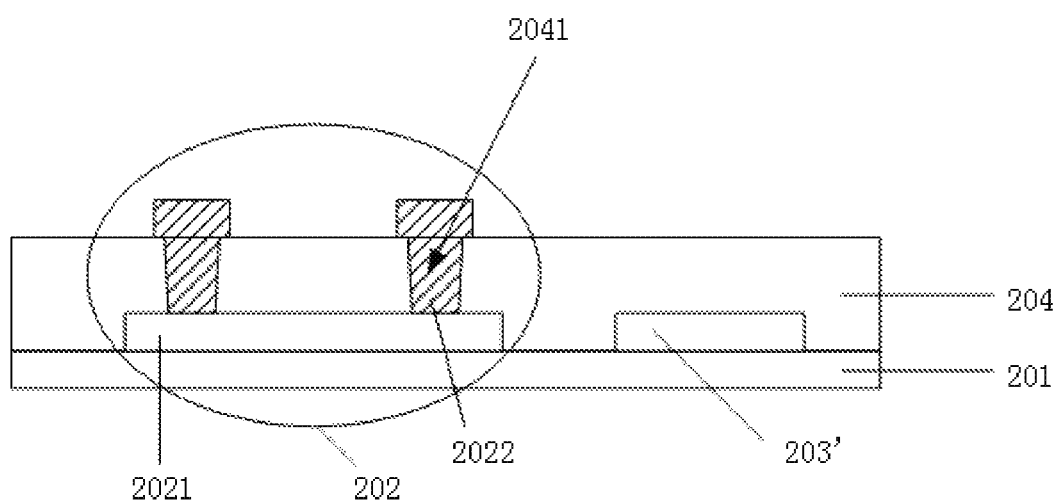
FIG. 10 is a schematic view of a method for manufacturing an OLED display panel in accordance with an embodiment of the present disclosure.

In an exemplary embodiment, the thin film transistor and the photosensitive device are formed on the same side of the substrate. As shown in FIG. 9, an active layer 2021 of a thin film transistor and a photosensitive device 203' for fingerprint recognition are formed on the same side of the substrate 201. As shown in FIG. 10, a transparent dielectric layer 204 is formed on the substrate 201, the active layer 2021 and the photosensitive device 203', the transparent dielectric layer 204 is patterned to form an opening 2041 in the transparent dielectric layer 204, and a source/drain electrode 2022 of the thin film transistor 202 being connected to the active layer 2021 through the opening 2041 is formed.

In an embodiment of the present disclosure, a projection of the photosensitive device 203 on the substrate 201 does not overlay with a projection of the thin film transistor 202 on the substrate 201.

The steps of forming the subsequent structure on the structure shown in FIG. 8 are similar to those of FIG. 10. Here, detail description is made with reference to FIG. 8.

In step S604 shown in FIG. 6, a light-shielding-planarization single layer is formed on the transparent dielectric layer.

In an exemplary embodiment, a material of the light-shielding-planarization single layer includes a black organic material.

In an exemplary embodiment, the black organic material includes a non-photosensitive polyimide resin.

In order to obtain a hole having a smaller diameter, the light-shielding-planarization single layer can be patterned by forming a patterned barrier layer on the light-shielding-planarization single layer and using the barrier layer as a masking layer.

Figure 11:
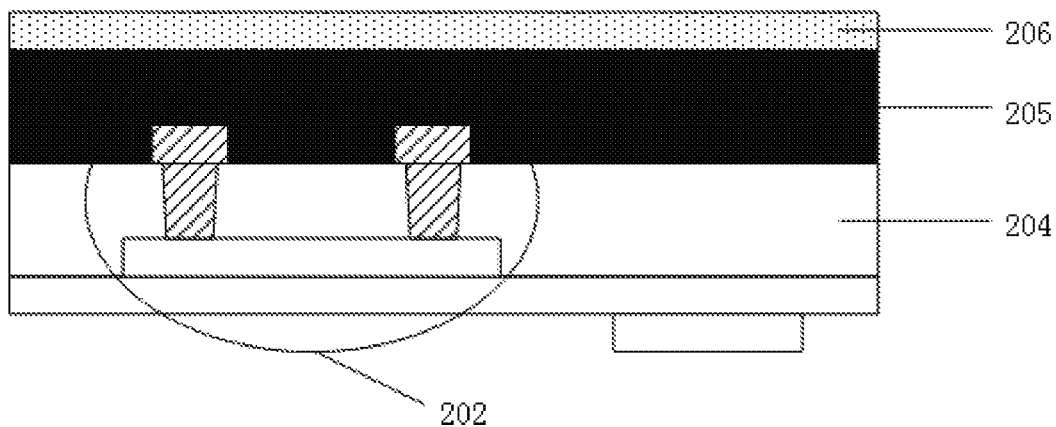
FIG. 11 is a schematic view of a method for manufacturing an OLED display panel in accordance with an embodiment of the present disclosure.

FIG. 11 is a schematic view of forming a light-shielding-planarization single layer and a barrier layer in accordance with an embodiment of the present disclosure.

As shown in FIG. 11, a light-shielding-planarization single layer 205 is formed on the transparent dielectric layer 204 and the thin film transistor 202, and a barrier layer 206 is formed on the light-shielding-planarization single layer 205.

In step S605 shown in FIG. 6, the light-shielding-planarization single layer is patterned to form a first hole and a second hole.

Figure 12:
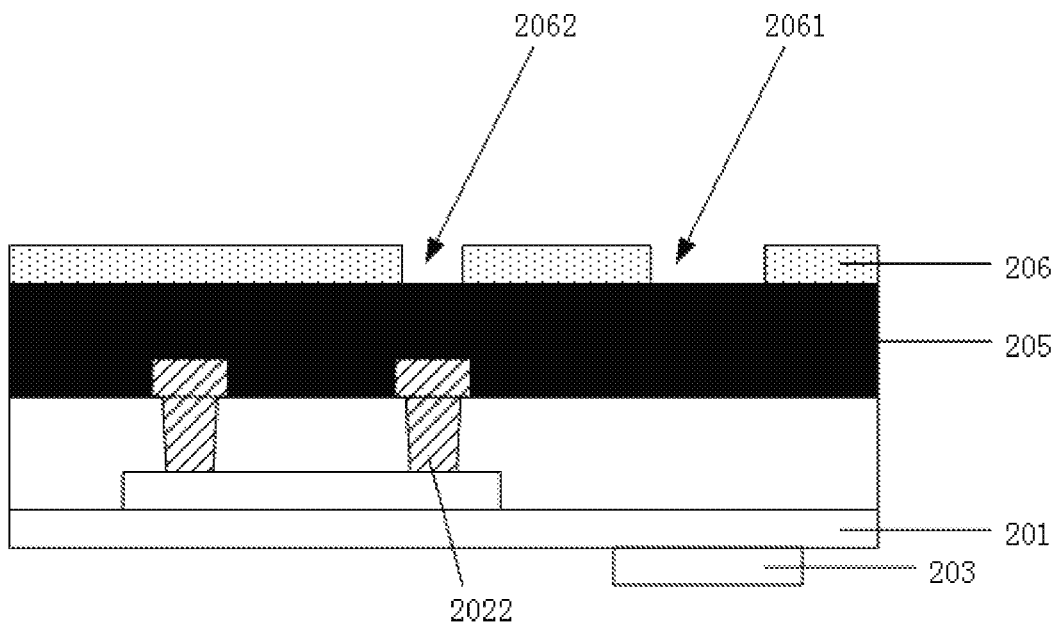
FIG. 12 is a schematic view of a method for manufacturing an OLED display panel in accordance with an embodiment of the present disclosure.

As shown in FIG. 12, the barrier layer 206 is patterned to form a third hole 2061 and a fourth hole 2062 exposing the light-shielding-planarization single layer 205. A projection of the third hole 2061 on the substrate 201 overlays with the projection of the photosensitive device 203 on the substrate 201. A projection of the fourth hole 2062 on the substrate 201 overlays with a projection of the source/drain electrode 2022 on the substrate 201.

Figure 13:
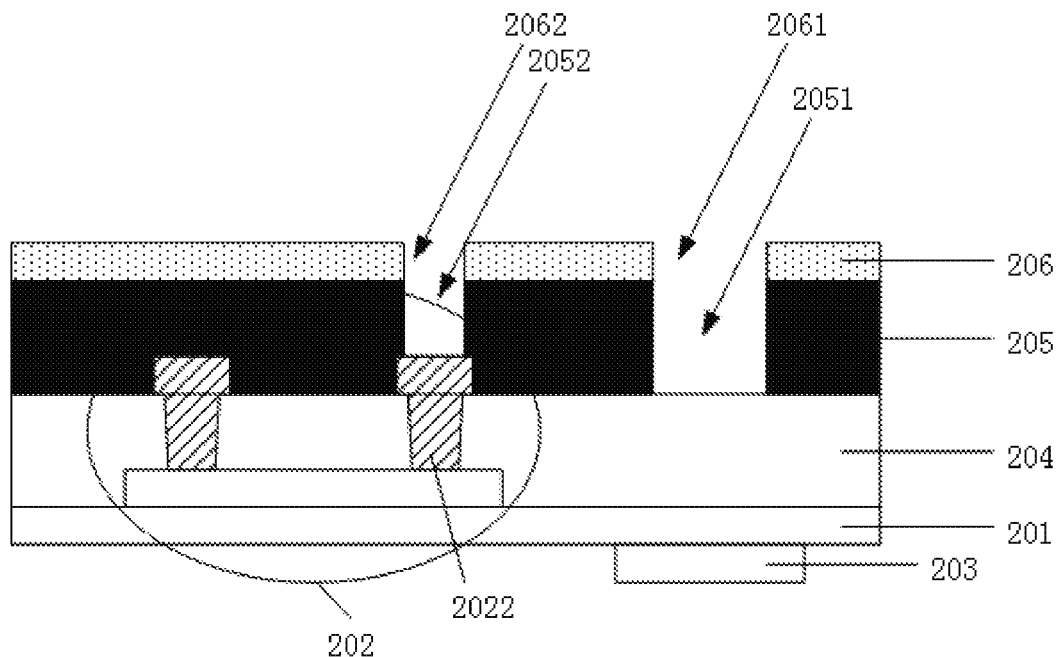
FIG. 13 is a schematic view of a method for manufacturing an OLED display panel in accordance with an embodiment of the present disclosure.

As shown in FIG. 13, patterning the light-shielding-planarization single layer 205 includes etching the light-shielding-planarization single layer 205 using the barrier layer 206 as a masking layer to form the first hole 2051 exposing the transparent dielectric layer 204 and the second hole 2052 exposing the source/drain electrode 2022 of the thin film transistor 202 in the light-shielding-planarization single layer 205. A projection of the first hole 2051 on the substrate 201 overlays with the projection of the photosensitive device 203 on the substrate 201.

In an exemplary embodiment, the above etching may be dry etching.

In step S606 shown in FIG. 6, an organic light emitting device is formed on the light-shielding-planarization single layer.

Figure 14:
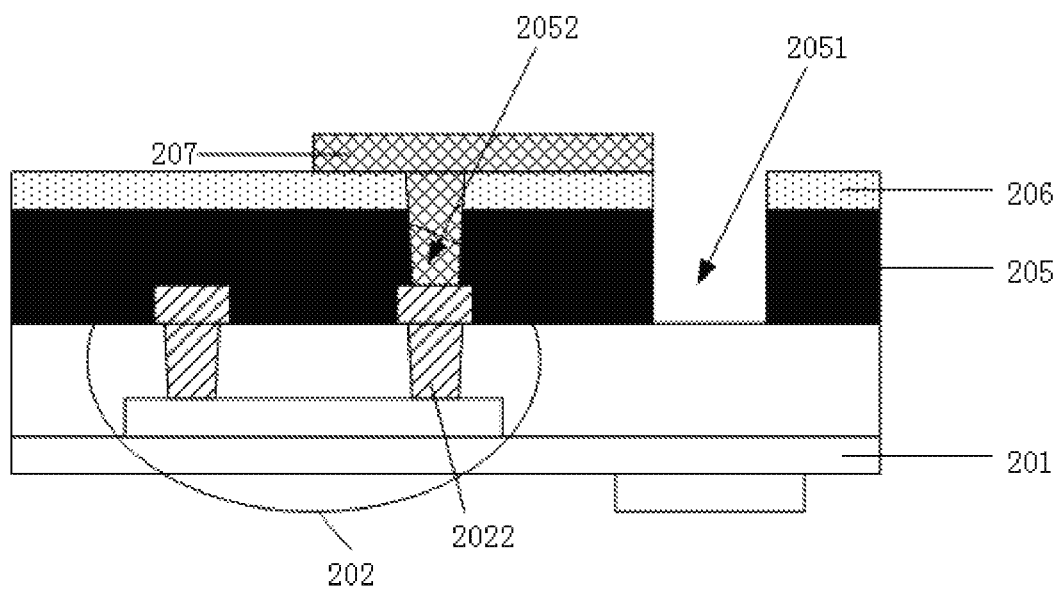
FIG. 14 is a schematic view of a method for manufacturing an OLED display panel in accordance with an embodiment of the present disclosure.

FIG. 14 is a schematic view of forming an organic light emitting device in accordance with an embodiment of the present disclosure. As shown in FIG. 14, an organic light emitting device 207 is formed on the barrier layer 206. A projection of the organic light emitting device 207 on the substrate 201 does not overlay with the projection of the first hole 2051 on the substrate 201. The organic light emitting device 207 is connected to the source/drain electrodes 2022 of the thin film transistor 202 through the second hole 2052.

It should be noted that the steps of forming the subsequent structure on the structure shown in FIG. 10 are similar to those in FIG. 6, which will not be repeated herein.

In an embodiment of the present disclosure, there are provided an OLED display panel and a method for manufacturing the same. The light-shielding-planarization single layer in accordance with an embodiment of the present disclosure can simultaneously realize both light-shielding and planarization functions using a single material layer. In addition, the material of the light-shielding-planarization single layer is a black organic material, which can avoid causing static electricity accumulation.

The foregoing description of the embodiments has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

The invention claimed is:

1. An OLED display panel, comprising:
a substrate;
a thin film transistor and a photosensitive device for fingerprint recognition on the substrate; a transparent dielectric layer on the substrate and the thin film transistor;
a light-shielding-planarization single layer on the transparent dielectric layer, wherein the light-shielding-planarization single layer has a first hole exposing the transparent dielectric layer, and a projection of the first hole on the substrate overlays with a projection of the photosensitive device on the substrate; and
an organic light emitting device on the light-shielding-planarization single layer, wherein the organic light emitting device is connected to a source/drain electrode of the thin film transistor through a second hole penetrating the light-shielding-planarization single layer.

2. The OLED display panel according to claim 1, wherein a material of the light-shielding-planarization single layer comprises a black organic material.

3. The OLED display panel according to claim 2, wherein the black organic material comprises polyimide.

4. The OLED display panel according to claim 1, further comprising a barrier layer between the light-shielding-planarization single layer and the light emitting device, wherein the barrier layer has a third hole exposing the transparent dielectric layer, a sidewall of the third hole is continuous with a sidewall of the first hole.

5. The OLED display panel according to claim 4, wherein the thin film transistor and the photosensitive device are on the same side of the substrate.

6. The OLED display panel according to claim 4, wherein the thin film transistor and the photosensitive device are on different sides of the substrate.

7. The OLED display panel according to claim 1, wherein a diameter range of the first hole is 2-3 μm.

8. The OLED display panel according to claim 7, wherein the substrate is transparent.

9. A display device comprising the OLED display panel according to claim 1.

10. A method for manufacturing an OLED display panel, comprising:
providing a substrate;
forming a thin film transistor and a photosensitive device for fingerprint recognition on the substrate;
forming a transparent dielectric layer covering the substrate and the thin film transistor;

forming a light-shielding-planarization single layer on the transparent dielectric layer; patterning the light-shielding-planarization single layer to form a first hole exposing the transparent dielectric layer and a second hole exposing a source/drain electrode of the thin film transistor in the light-shielding-planarization single layer, wherein a projection of the first hole on the substrate overlays with a projection of the photosensitive device on the substrate; and forming an organic light emitting device on the light-shielding-planarization single layer, wherein the organic light emitting device is connected to the source/drain electrode of the thin film transistor through the second hole.

11. The method according to claim 10, wherein a material of the light-shielding-planarization single layer comprises a black organic material.

12. The method according to claim 11, wherein the black organic material comprises polyimide.

13. The method according to claim 10, further comprising: after forming the light-shielding-planarization single layer and before patterning the light-shielding-planarization single layer, forming a barrier layer on the light-shielding-planarization single layer; and patterning the barrier layer to form a third hole and a fourth hole exposing the light-shielding-planarization single layer, wherein a projection of the third hole on the substrate overlays with the projection of the photosensitive device on the substrate, and a projection of the fourth hole on the substrate overlays with a projection of the source/drain electrode on the substrate, wherein patterning the light-shielding-planarization single layer comprises etching the light-shielding-planarization single layer using the barrier layer as a mask to form the first hole and the second hole.

14. The method according to claim 10, wherein forming a thin film transistor and a photosensitive device for fingerprint recognition on the substrate comprises forming the thin film transistor and the photosensitive device on the same side of the substrate.

15. The method according to claim 10, wherein forming a thin film transistor and a photosensitive device for fingerprint recognition on the substrate comprises forming the thin film transistor and the photosensitive device on opposite sides of the substrate, respectively.

16. A display device comprising the OLED display panel according to claim 4.

17. A display device comprising the OLED display panel according to claim 5.

18. A display device comprising the OLED display panel according to claim 6.

19. The method according to claim 13, wherein forming a thin film transistor and a photosensitive device for fingerprint recognition on the substrate comprises forming the thin film transistor and the photosensitive device on the same side of the substrate.

20. The method according to claim 13, wherein forming a thin film transistor and a photosensitive device for fingerprint recognition on the substrate comprises forming the thin film transistor and the photosensitive device on opposite sides of the substrate, respectively.

* * * * *